United States Patent
Jang et al.

(10) Patent No.: US 10,547,020 B2
(45) Date of Patent: Jan. 28, 2020

(54) WHITE ORGANIC LIGHT EMITTING DEVICE INCLUDING MULTIPLE STACKS HAVING THREE PHOTOLUMINESCENCE PEAKS AND ORGANIC LIGHT EMITTING DISPLAY DEVICE USING THE SAME

(71) Applicant: LG Display Co., Ltd., Seoul (KR)

(72) Inventors: Jae-Seung Jang, Seoul (KR); Tae-Shick Kim, Yongin-si (KR); Hyung-June Kim, Goyang-si (KR); Min Yun, Suwon-si (KR); Tae-Seok Lim, Seoul (KR)

(73) Assignee: LG Display Co., Ltd., Seoul (KR)

(*) Notice: Subject to any disclaimer, the term of this patent is extended or adjusted under 35 U.S.C. 154(b) by 60 days.

(21) Appl. No.: 15/661,871

(22) Filed: Jul. 27, 2017

(65) Prior Publication Data
US 2018/0033994 A1    Feb. 1, 2018

(30) Foreign Application Priority Data

Jul. 29, 2016 (KR) .......................... 10-2016-0097391

(51) Int. Cl.
*H01L 29/08* (2006.01)
*H01L 51/50* (2006.01)
*H01L 27/32* (2006.01)

(52) U.S. Cl.
CPC ...... *H01L 51/5036* (2013.01); *H01L 27/3262* (2013.01); *H01L 51/5004* (2013.01); *H01L 51/5024* (2013.01); *H01L 51/5076* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 8,921,834 B2* | 12/2014 | Tomono | ................ | C09K 11/06 |
| | | | | 257/40 |
| 9,515,280 B2* | 12/2016 | Yun | ...................... | H01L 51/5024 |
| 9,859,517 B2* | 1/2018 | Lai | ...................... | H01L 51/5016 |
| 10,020,458 B2* | 7/2018 | Cho | .................... | H01L 51/5024 |
| 2007/0122655 A1* | 5/2007 | Deaton | .................. | C09K 11/06 |
| | | | | 428/690 |
| 2014/0070196 A1* | 3/2014 | Kim | ...................... | H01L 51/504 |
| | | | | 257/40 |
| 2014/0117338 A1* | 5/2014 | Cho | .................... | H01L 51/5044 |
| | | | | 257/40 |
| 2014/0183499 A1* | 7/2014 | Kim | .................... | H01L 27/3213 |
| | | | | 257/40 |
| 2015/0060825 A1* | 3/2015 | Song | .................. | H01L 51/5278 |
| | | | | 257/40 |

* cited by examiner

*Primary Examiner* — Caleb E Henry
(74) *Attorney, Agent, or Firm* — Polsinelli PC

(57) ABSTRACT

A white organic light emitting device, which is increased in color gamut and lifespan, is discussed and an organic light emitting display device using the same and in a stack having different emission layers disposed in contact with each other, particular properties of a host and a dopant in a major emission layer are used.

18 Claims, 7 Drawing Sheets

WHITE ORGANIC LIGHT EMITTING DEVICE INCLUDING MULTIPLE STACKS HAVING THREE PHOTOLUMINESCENCE PEAKS AND ORGANIC LIGHT EMITTING DISPLAY DEVICE USING THE SAME

CROSS REFERENCE TO RELATED APPLICATION

This application claims the benefit of Korean Patent Application No. 10-2016-0097391, filed on Jul. 29, 2016 which is hereby incorporated by reference in its entirety as if fully set forth herein.

BACKGROUND

Field of the Disclosure

The present disclosure relates to a display device, and more particularly, to a white organic light emitting device having a broader color gamut and an increased lifespan, and an organic light emitting display device using the same.

Description of the Background

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light emitting display (OLED) device.

Among these, the organic light emitting display device has a competitive edge over others because it does not require a separate light source and enables realization of a compact device design and vivid color display.

Such an organic light emitting display device essentially requires the formation of an organic emission layer. Conventionally, a deposition method using a shadow mask has been used to form the organic emission layer.

However, alternatives are required, because the shadow mask undergoes a drooping phenomenon due to the weight thereof when it has a large area, and thus is difficult to use multiple times and causes defective formation of an organic emission layer pattern.

One of several methods proposed to replace the shadow mask is a tandem-type white organic light emitting device (hereinafter referred to as a "white organic light emitting device"). Hereinafter, the white organic light emitting device will be described.

The white organic light emitting device has features such that a light emitting diode is formed by depositing respective organic layers between an anode and a cathode without using a mask and such that the organic layers including an organic emission layer are sequentially deposited using different components under a vacuum state. In addition, the white organic light emitting device includes different emission layers, which emit multiple colors of light, between the anode and the cathode, and a charge generation layer is provided between the respective emission layers so that stacks are divided from each other on the basis of each emission layer, which is a basic structure.

The white organic light emitting device described above does not emit light using one material, but realizes light emission by multiple emission layers located at different positions in the device, the emission layers including emissive materials having different photoluminescence (PL) peaks for each wavelength, white light being generated via the combination of light emitted from the multiple layers. In one example, a stack including a fluorescent layer and a stack including a phosphorescent layer may be stacked one above another to realize the white organic light emitting device.

However, stack structures known to date have failed to achieve sufficient efficiency of the white organic light emitting device and have different efficiency for each color, thus undergoing variation in color characteristics during long-time driving. In addition, sufficient color gamut may not be realized upon display.

SUMMARY OF THE DISCLOSURE

Accordingly, the present disclosure is directed to a white organic light emitting device and an organic light emitting display device using the same that substantially obviate one or more problems due to limitations and disadvantages of the related art.

In addition, the present disclosure is to provide a white organic light emitting device, which has a broader color gamut and an increased lifespan, and an organic light emitting display device using the same.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve the above and other advantages and in accordance with the purpose of the disclosure, as embodied and broadly described herein, a white organic light emitting device according to the present disclosure the structure of including multiple stacks having three photoluminescence peaks, thereby achieving an increased lifespan and a broader color gamut. To this end, any one of the multiple stacks includes different emission layers, which are in contact with each other, and the energy band gap of a major emission layer among the neighboring emission layers is controlled to equalize hole injection and electron injection, which may increase the efficiency of combination of holes and electrons in the neighboring emission layers, resulting in an increased lifespan.

According to an aspect of the present disclosure, in a white organic light emitting device including a first electrode, first to third stacks sequentially disposed on the first electrode, and a second electrode on the third stack, any one stack among the first to third stacks includes a first emission layer and a second emission layer that emit different colors of light, and the first emission layer and the second emission layer are in contact with each other, and the first emission layer consists of a single electron transport host and a first dopant having a lowest unoccupied molecular orbital (LUMO) energy level lower than a LUMO energy level of the electron transport host.

The first dopant may have a highest occupied molecular orbital (HOMO) energy level higher than a HOMO energy level of the single electron transport host.

In this case, the first dopant may have a energy band gap ranging from 2.5 eV to 2.7 eV.

In addition, the electron transport host may have an electron mobility ranging from $1.0 \times 10^{-4}$ cm$^2$/Vs to $1.0 \times 10^{-2}$ cm$^2$/Vs.

Meanwhile, the first emission layer may be a green emission layer or a yellow-green emission layer having a first photoluminescence peak within a wavelength range from 520 nm to 560 nm, and the second emission layer may be a red emission layer having a second photoluminescence peak within a wavelength range from 600 nm to 650 nm.

In this case, each of the other stacks having no first and second emission layers may include a blue emission layer having a third photoluminescence peak within a wavelength range from 440 nm to 470 nm.

The first emission layer may include a plurality of first emission layers.

The first emission layers may respectively include the same host and the first dopant having different densities.

In addition, the white organic light emitting device may further include a first charge generation layer between the first stack and the second stack, and a second charge generation layer between the second stack and the third stack.

The first and second emission layers may be located in the second stack, the first stack and the third stack may include first and second blue emission layers respectively, and the white organic light emitting device may further include a common layer provided on at least one location selected from among a location between the first blue emission layer and the first electrode, a location between the second blue emission layer and the second electrode, a location between the red emission layer and the first charge generation layer, a location between the green emission layer and the second charge generation layer, a location between the first blue emission layer and the first charge generation layer, and a location between the second charge generation layer and the second blue emission layer.

According to another aspect of the present disclosure, an organic light emitting display device includes a substrate having a plurality of sub-pixels, a driving transistor provided in each sub-pixel on the substrate, and an organic light emitting diode including a first electrode and a second electrode, one of which is connected to the driving transistor, and which are opposite each other, and first to third stacks between the first electrode and the second electrode, wherein any one stack among the first to third stacks includes a first emission layer and a second emission layer that emit different colors of light, and the first emission layer and the second emission layer are in contact with each other, and wherein the first emission layer consists of a single electron transport host and a first dopant having a LUMO energy level lower than a LUMO energy level of the electron transport host.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
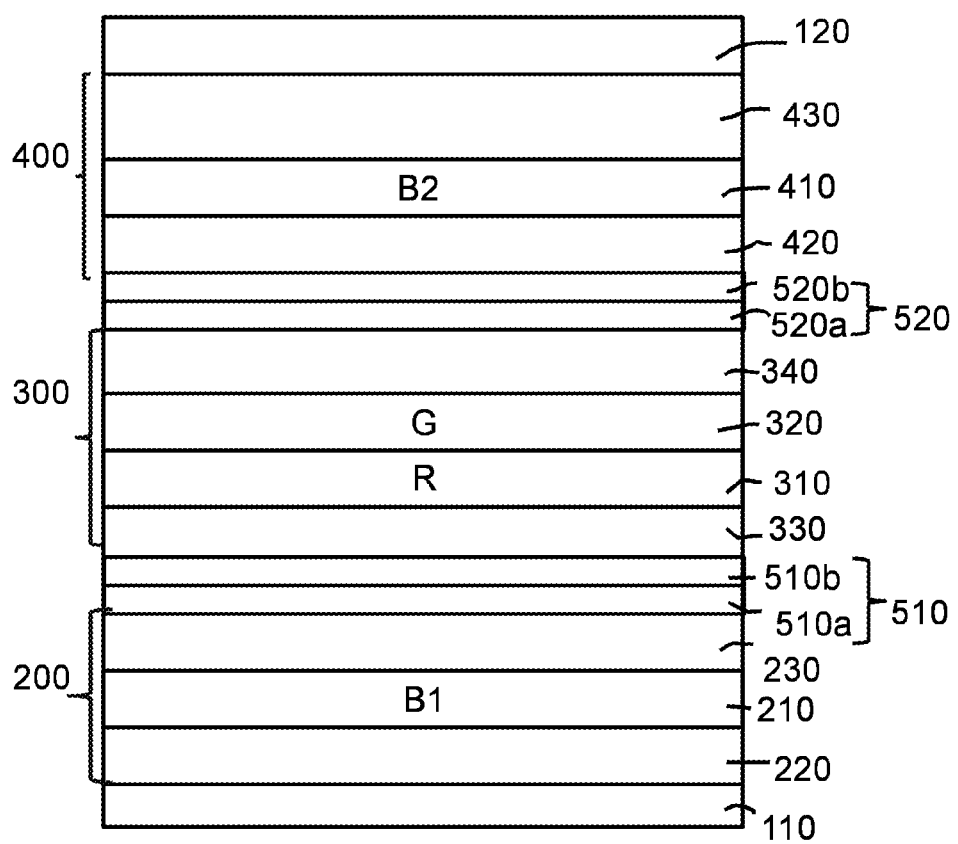
FIG. 1 is a cross-sectional view illustrating a white organic light emitting device according to the present disclosure.

The advantages and features of the present disclosure and the way of attaining them will become apparent with reference to aspects described below in detail in conjunction with the accompanying drawings. Aspects, however, may be embodied in many different forms and should not be constructed as being limited to example aspects set forth herein. Rather, these example aspects are provided so that this disclosure will be through and complete and will fully convey the scope to those skilled in the art. The scope of the present disclosure should be defined by the claims.

In the drawings for explaining the exemplary aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the description of the various aspects of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various aspects of the present disclosure may be partially or wholly coupled to and combined with each other, and various technical linkage and driving thereof are possible. These various aspects may be performed independently of each other, or may be performed in association with each other.

In this specification, the "lowest unoccupied molecular orbital (LUMO) energy level" and the "highest occupied molecular orbital (HOMO) energy level" of any layer mean the LUMO energy level and the HOMO energy level of the material that occupies the greatest weight percentage of the corresponding layer, for example, a host material, unless they are referred to as the LUMO energy level and the HOMO energy level of a dopant material that is doped in the corresponding layer.

In this specification, the "HOMO energy level" may be the energy level that is measured via a cyclic voltammetry (CV) method, which determines the energy level from a potential value relative to a reference electrode having a known potential value. For example, the HOMO energy level of any material may be measured by using, as the reference electrode, ferrocene that has a known oxidation potential value and a known reduction potential value.

In this specification, the term "doped" means that a material of any layer, which has physical properties (e.g., N-type and P-type, or an organic material and an inorganic material) different from the material that occupies the greatest weight percentage of the corresponding layer, is added to the material accounting for the greatest weight percentage in an amount corresponding to a weight percentage of less than 10%. In other words, a "doped" layer means a layer in which a host material and a dopant material of any layer are distinguishable from each other in consideration of the weight percentages thereof. In addition, the term "undoped" refers to all cases excluding the case that corresponds to the term "doped". For example, when any layer is formed of a single material or is formed of a mixture of materials having the same or similar properties, the layer is included in an "undoped" layer. For example, when at least one of constituent materials of any layer is of a p-type and all of the other constituent materials of the layer are not of an N-type, the layer is included in the "undoped" layer. For example, when at least one of the constituent materials of any layer is an organic material and all of the other constituent materials of the layer are not an inorganic material, the layer is included in the "undoped" layer. For example, when all constituent materials of any layer are organic materials, at least one of the constituent materials is of an N-type, at least another constituent material is of a P-type, and the weight percent of the N-type material is less than 10% or the weight percent of the P-type material is less than 10%, the layer is included in the "doped" layer.

In this specification, an electroluminescence (EL) spectrum is calculated by multiplying (1) a photoluminescence (PL) spectrum, which applies the inherent characteristics of an emissive material such as a dopant material or a host material included in an organic emission layer, by (2) an outcoupling or emittance spectrum, which is determined by the structure and optical characteristics of an organic light emitting device including the thicknesses of organic layers such as, for example, an electron transport layer.

In this specification, a stack means a unit structure that includes organic layers such as a hole transport layer and an electron transport layer and an organic emission layer interposed between the hole transport layer and the electron transport layer. The organic layers may further include a hole injection layer, an electron blocking layer, a hole blocking layer, and an electron injection layer, and may further include other organic layers according to the structure or design of an organic light emitting device.

First, a white organic light emitting device of the present disclosure will be described. In an organic light emitting display device, the white organic light emitting device means a configuration that implements light emission, excluding a drive circuit. When a plurality of sub-pixels provided on a substrate has the arrangement of red, green, blue and white (RGBW) sub-pixels, the white organic light emitting device may correspond to a white sub-pixel. Alternatively, in an organic light emitting display device, all sub-pixels on a substrate may respectively include white organic light emitting devices in common, and color filters may be provided thereon for color display.

Figure 2:
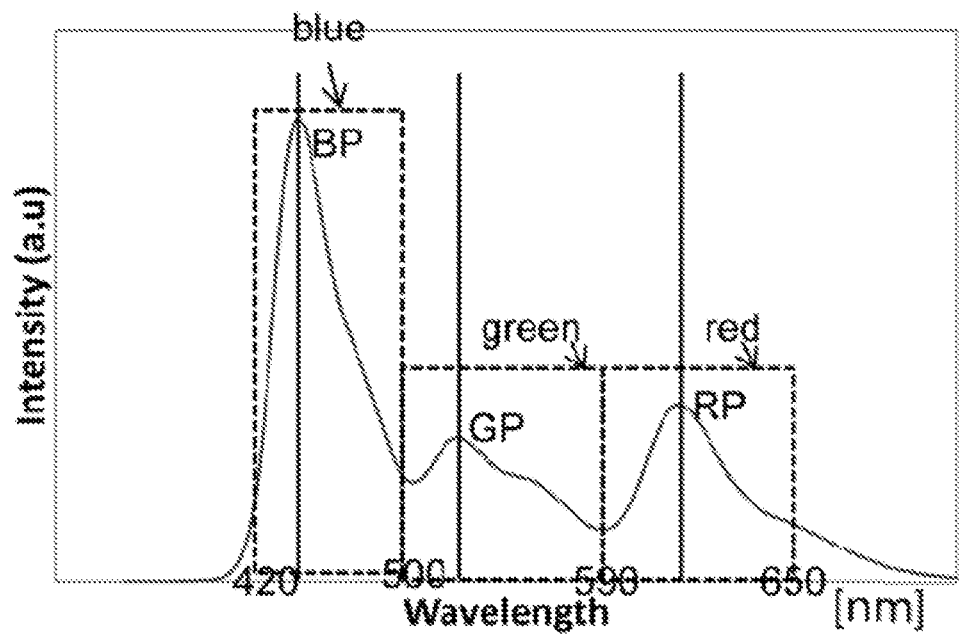
FIG. 2 is a graph illustrating the photoluminescence intensity of the white organic light emitting device for each wavelength according to the present disclosure.

FIG. 1 is a cross-sectional view illustrating a white organic light emitting device according to the present disclosure, and FIG. 2 is a graph illustrating the photoluminescence intensity of the white organic light emitting device for each wavelength according to the present disclosure. In addition, FIG. 3 is a diagram illustrating the energy band of a second stack having different emission layers in contact with each other in the white organic light emitting device according to the present disclosure.

Figure 3:
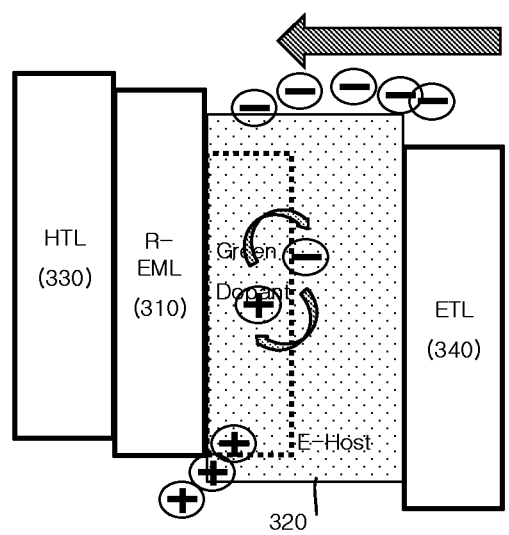
FIG. 3 is a diagram illustrating the energy band of a second stack having different emission layers in contact with each other in the white organic light emitting device according to the present disclosure.

As illustrated in FIGS. 1 to 3, the white organic light emitting device of the present disclosure includes a first electrode 110, first to third stacks 200, 300 and 400 sequentially disposed on the first electrode 110, and a second electrode 120 on the third stack 400.

Among the first to third stacks 200, 300 and 400, the second stack 300 includes a green emission layer 320 having a first photoluminescence peak within a wavelength range from 520 nm to 590 nm, and a red emission layer 310 having a second photoluminescence peak within a wavelength range from 610 nm to 650 nm, the green emission layer 320 and the red emission layer 310 being in contact with each other. Each of the other stacks 200 and 400 includes a blue emission layer 210 or 410 having a third photoluminescence peak within a wavelength range from 440 nm to 470 nm. More specifically, the photoluminescence peaks of the blue emission layer, the green emission layer and the red emission layer may be respectively within a wavelength range from 440 nm to 470 nm, within a wavelength range from 520 nm to 560 nm, and within a wavelength range from 610 nm to 640 nm.

The reason why the photoluminescence peaks of the emission layers should be limited to the above-described ranges is as follows.

For even color display based on international standards, total light emitted from the top or bottom of multiple stacks needs to have an emission spectrum in which three peaks clearly appear in red, green and blue. To this end, the photoluminescence peaks are included in the above-described particular ranges.

However, when the second stack 300 includes the red emission layer 310 and the green emission layer 320, which are in contact with each other as described above, although an excellent color gamut is achieved because the three peaks clearly appear, the efficiency of electron injection to the green emission layer 320 is continuously reduced during long-time driving. Therefore, a structure for compensating for such a problem is proposed.

That is, in the white organic light emitting device of the present disclosure, the green emission layer 320 and the red emission layer 310 of the second stack 300, which emit different colors of light, are in contact with each other, and as illustrated in FIG. 3, the green emission layer 320 includes a single electron transport host E-host and a green dopant having a LUMO energy level lower than the LUMO energy level of the electron transport host E-host.

In this case, the single electron transport host may have electron mobility ranging from $1.0 \times 10^{-4}$ cm$^2$/Vs to $1.0 \times 10^{-2}$ cm$^2$/Vs, and may increase the efficiency of electron injection to the green emission layer 320.

Here, the HOMO energy level of the green dopant may be higher than the HOMO energy level of the single electron transport host E-host so that the energy band gap of the green dopant is included in the energy band gap of the single electron transport host E-host. In this case, the green dopant has a strong hole-trapping property, and consequently has good hole transport capability from a hole transport layer 330 close thereto or the red emission layer 310. In particular, the green dopant may interact with the electron transport host E-host so as to gather electrons and holes in the green emission layer 320, thereby facilitating the smooth generation of excitons via combination of the holes and electrons in the green emission layer 320.

In this case, the energy band gap of the green dopant ranges from about 2.5 eV to about 2.7 eV. For example, when the energy band gap of the green dopant is included in the energy band gap of the electron transport host, the electron transport host of the green emission layer may have an LUMO energy level ranging from −3.0 eV to −2.8 eV and a HOMO energy level ranging from −5.6 eV to −5.8 eV.

In the red emission layer 310, which is close to the green emission layer 320, a host thereof has a LUMO energy level approximately ranging from −2.7 eV to −2.5 eV and a HOMO energy level ranging from −5.6 eV to −5.4 eV, and the energy band gap of the red emission layer 310 overlaps most of the energy band gap of the green emission layer 320 and is located thereabove. In addition, the hole transport layer 330, which is in contact with the host of the red emission layer 310, has a LUMO energy level approximately ranging from −2.2 eV to −2.5 eV and a HOMO energy level ranging from −5.4 eV to −5.2 eV. The energy band gaps of the hole transport layer 330, the red emission layer 310 and the green dopant in the green emission layer 320, which has a strong hole-trapping property, partially overlap each other and are gradually stepped downward, thereby implementing hole transport. In addition, the electron transport host in the green emission layer 320 implements electron transport so as to equalize hole injection and electron injection to the green emission layer 320. Thereby, in the entire white organic light emitting device, holes or electrons are not accumulated in a particular layer, which may result in an increase in luminous efficacy and lifespan.

Meanwhile, the red emission layer 310 may include both a hole transport host and an electron transport host, or may include only one of the two hosts. In some cases, when the red emission layer 310 includes a single hole transport host and a red dopant, the red emission layer 310 may exhibit excellent hole transport, thereby further assisting in hole transport to the green emission layer 320.

Meanwhile, in the white organic light emitting device of the present disclosure, the green emission layer 320 includes a single electron transport host, and a small amount of green dopant that exhibits excellent hole transport (i.e. excellent electron discharge) is mixed thereto so as to adjust the charge balance of the green emission layer 320, which may result in an increase in lifespan.

Although an example in which the stack having difference colors of emission layers in contact with each other is located at an intermediate position has been described above, the present disclosure is not limited to this example, and a stack having multiple emission layers may be located at any other position. In addition, the white organic light emitting layer may include a greater number of stacks than the three stacks illustrated in the example, and in this case, several stacks may include the same emission layer.

Meanwhile, in the present disclosure, photoluminescence peaks BP, GP and RP mean the maximum photoluminescence intensity of each emission layer. As can be seen from the graph of FIG. 2, the photoluminescence peak, which is the maximum photoluminescence intensity, may deviate to one side from the center of each emission color wavelength range. A blue photoluminescence peak and a green photoluminescence peak appear at positions that are shifted leftward from the center of each corresponding wavelength range.

The white organic light emitting device of the present disclosure has the feature whereby the photoluminescence peak is within a particular range. A single stack implements green light emission and red light emission at the same time, which realizes light emission distribution corresponding to human vision for each wavelength, and results in an even color gamut over the entire range of visible light.

In addition, the photoluminescence peak (photoluminescence intensity) of the blue emission layer is higher than the photoluminescence peaks of the other two emission layers. This is because blue emissive materials that have been developed to data have relatively low visibility and luminous efficacy, and therefore require a photoluminescence intensity higher than that of the other emission layers in order to realize white light. For example, on the basis of the same wavelength, the photoluminescence peak (photoluminescence intensity) of the blue emission layer needs to be at least two times higher than the photoluminescence peak (photoluminescence intensity) of the green emission layer or the red emission layer. To this end, the white organic light emitting layer includes two stacks each including the blue emission layer, compared to the single stack including other emission layers.

However, when a blue emissive material, which has the same level of luminous efficacy as that of other colors of emissive materials, is developed, white light emission may be realized using double stacks, i.e. a stack including the blue emission layer and a stack including both the red emission layer and the green emission layer disposed in contact with each other.

In addition, although the photoluminescence peak of the green emission layer is slightly higher than the photoluminescence peak of the red emission layer, the difference is minimal, and these photoluminescence peaks may be changed according to the amount or height of a host and a dopant used in each emission layer. It was found via experimentation that a satisfactory color gamut encompassing green, red and blue is achieved when the photoluminescence peak of the red emission layer is higher than the photoluminescence peak of the green emission layer.

In the white organic light emitting layer of the present disclosure, through realizing appropriate distances between the photoluminescence peaks BP, GP and RP of respective colors of light, appropriate distribution of red, green and blue display regions is achieved, which results in a broader color gamut.

In some cases, the red emission layer 310 described above includes a red host and a red dopant, and the red host is a hole transport host having a bipolar property and a strong hole-trapping property.

Due to the fact that the red emission layer 310 is located between a first charge generation layer 510 and the green emission layer 320, the red emission layer 310 traps electrons leaking from the green emission layer 320, which is a main emission layer, so as to allow the electrons to contribute to red light emission, which increases the luminous efficacy of red light, and consequently contributes to an increase in color gamut and brightness.

A host material used in the red emission layer 310 includes an aryl group as a core, and may include one of an aryl group, a substituted or unsubstituted aryl group having a carbon number of 6 to 24, a substituted or unsubstituted fused aryl group having a carbon number of 10 to 30, a substituted or unsubstituted hetero aryl group having a carbon number of 2 to 24, a substituted or unsubstituted alkyl group having a carbon number of 1 to 24, a substituted or unsubstituted hetero alkyl group having a carbon number of 1 to 24, a substituted or unsubstituted cyclo alkyl group having a carbon number of 3 to 24, a substituted or unsubstituted alkoxy group having a carbon number of 1 to 24, a substituted or unsubstituted aryl oxy group having a carbon number of 6 to 24, a substituted or unsubstituted alkyl silyl group having a carbon number of 1 to 24, a substituted or unsubstituted aryl silyl group having a carbon number of 6 to 24, a cyano group, a halogen group, heavy hydrogen and hydrogen.

In addition, the aryl group, which is a core component, may include one of phenyl, naphthalene, fluorene, carbazole, phenazine, phenanthroline, phenanthridine, acridine, cinnoline, quinazoline, quinoxaline, naphthyridine, phthalazine, quinolizine, indole, indazole, pyridazine, pyrazine, pyrimidine, pyridine, pyrazole, imidazole, and pyrrole.

In one example, a host material of the red emission layer 310 may include one or multiple ones of CBP, CDBP, mCP, BCP, BAlq, and TAZ.

In addition, the red emission layer 310 includes a dopant to emit red light, and a phosphorescent dopant may be, for example, Ir(piz)3(Tris-(1-phenylisoquinoline)iridium(III)), Ir(piq)2(acac)(B is-(1-phenylisoquinoline)(acetylacetonate)iridium(III)), Ir(btp)2(acac)(Bis-(2-benzol[b]thiophen-2-yl-pyridine(acetylacetonate)iridium(III)), or Ir(BT)2(acac)(B is-(2-phenylbenzothiazolato)(acetylacetonate)iridium(III)), without being limited thereto.

In addition, examples of a fluorescent dopant, which may be included in the red emission layer 310, may include Rubrene(5,6,11,12-tetraphenylnaphthacene) and DCJTB(4-(dicyanlmethylene)-2-tert-butyl-6-(1,1,7,7-tetramethyljuloidin-4-yl-vinyl)-4H-pyran).

In addition, in one example, a host material of the green emission layer 320 may include C-545T(10-(2-benzothiazolyl)-1,1,7,7-tetramethyl-2,3,6,7-tetrahydro-1H,5H), 11H-[1]benzo-pyrano[6,7,8-ij]quinolizin-11-one), which use Alq3 as a matrix, derivatives thereof, quinacridone derivatives, and carbazole derivatives such as, for example, CBP, mCP, TCTA and TCP. Although Alq3 may emit green light by itself when it is used as a host, a green dopant is included in order to increase the luminous efficacy of green light, and may be one of a phosphorescent dopant and a fluorescent dopant. For example, the green dopant may be Ir(mppy)3, Ir(ppy)3, or Ir(ppy)2(acac).

Here, the blue emission layers 210 and 410 emit light within a wavelength range from 420 nm to 500 nm, the green emission layer 320 emits light within a wavelength range from 500 nm to 590 nm, and the red emission layer 310 emits light within a wavelength range from 590 nm to 660 nm, and the photoluminescence peaks of the respective emission layers are included in the above-described wavelength ranges.

Each of the blue emission layers 210 and 410 may include at least one blue host and at least one blue dopant. Specifically, each blue emission layer may be formed by doping at least one fluorescent host, which may include one of an anthracene derivative, a pyrene derivative, and a perylene derivative, with a fluorescent blue dopant. When a stable phosphorescent blue material is developed, it may be used as a substitute for the aforementioned materials.

In addition, as illustrated in FIG. 1, the white organic light emitting device according to a first aspect of the present disclosure may further include the first charge generation layer 510 between the first stack 200 and the second stack 300 and a second charge generation layer 520 between the second stack 300 and the third stack 400. Here, the first charge generation layer 510 may be in contact with the red emission layer 310. In this case, the second stack 300 has no hole transport layer between the first charge generation layer 510 and the red emission layer 310, and the red emission layer 310 includes a hole transport host and assists in hole transport from the first charge generation layer 510 to the green emission layer 320, in addition to emitting red light.

In addition, the first to third stacks 200, 300 and 400 may further include common layers between the respective emission layers thereof and the electrodes or between the respective emission layers thereof and the charge generation layers. For example, the stacks may further include a first common layer 220 between the first electrode 110 and the first blue emission layer 210, a second common layer 230 between the first blue emission layer 210 and the first charge generation layer 510, a third common layer 340 between the green emission layer 320 and the second charge generation layer 520, a fourth common layer 420 between the second charge generation layer 520 and the second blue emission layer 410, and a fifth common layer 430 between the second blue emission layer 410 and the second electrode 120. Here, the common layers assist in hole injection/transport or electron injection/transport from the adjacent electrodes to the emission layers, or perform the transfer of electrons and/or holes to the adjacent stacks.

In addition, the first and second charge generation layers 510 and 520 may respectively include an n-type charge generation layer 510a or 520a and a p-type charge generation layer 510b or 520b. Here, the n-type charge generation layers 510a and 520a are in contact with the common layers 230 and 340 of the stacks thereunder, and the p-type charge generation layers 510b and 520b are respectively in contact with the red emission layer 310 or the common layer 420 of the stacks thereabove.

Here, no common layer may be provided between the red emission layer 310 and the first charge generation layer 510, and the red emission layer 310 may be directly formed on the first charge generation layer 510. Alternatively, a sixth common layer 330 may be further provided between the first charge generation layer 510 and the red emission layer 310. In the former case, the red emission layer 310 may necessarily include a hole transport host.

Meanwhile, in some cases, the red emission layer 310 and the green emission layer 320 may be disposed in a different order such that the green emission layer 320 is located below the red emission layer 310. In this case, the red emission layer 310 may include an electron transport host.

Hereinafter, the lifespan of the white organic light emitting device according to the present disclosure will be described, in comparison with a comparative example.

FIGS. 4A to 4D are cross-sectional views illustrating the arrangement of neighboring emission layers in a comparative example and experimental examples, and FIGS. 5A to 5D are graphs illustrating lifespan characteristics realized by the structures of FIGS. 4A to 4D.

In the comparative example and the experimental examples, red emission layers were equally formed to a thickness of 200 Å and respectively include a hole transport host, an electron transport host and a red dopant of 2.5 wt %. In the comparative example and the experimental examples, with the red emission layer to a thickness of 200 Å and includes a single electron transport host and a green dopant of 10 wt %, and subsequently, a second green emission layer was deposited to a thickness of 100 Å and includes two kinds of hosts (including both an electron transport host and a hole transport host with a ratio of 8:2), which are suitable for a yellow-green emission layer, and a green dopant of 7 wt %.

Figure 4A:
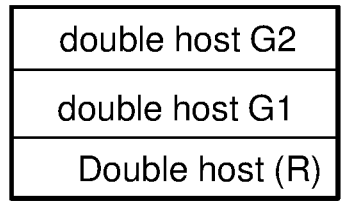
FIGS. 4A to 4D are cross-sectional views illustrating the arrangement of neighboring emission layers in a comparative example and experimental examples.
Figure 4B:
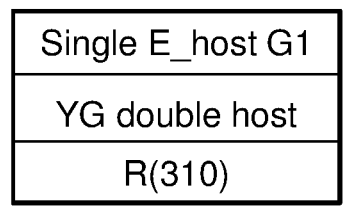
Figure 4C:
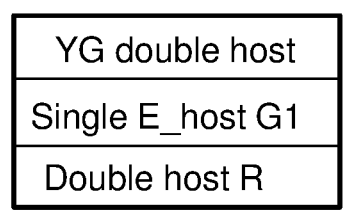
Figure 4D:
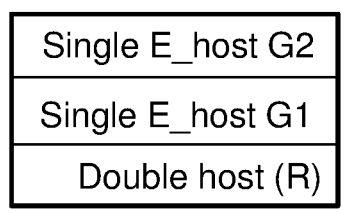
Figure 5A:
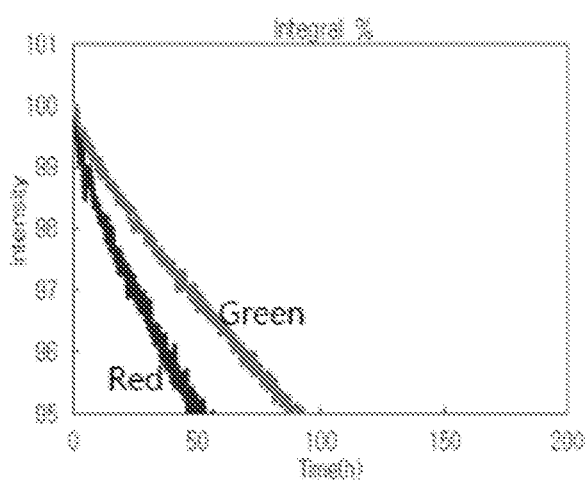
FIGS. 5A to 5D are graphs illustrating lifespan characteristics realized by the structures of FIGS. 4A to 4D.
Figure 5B:
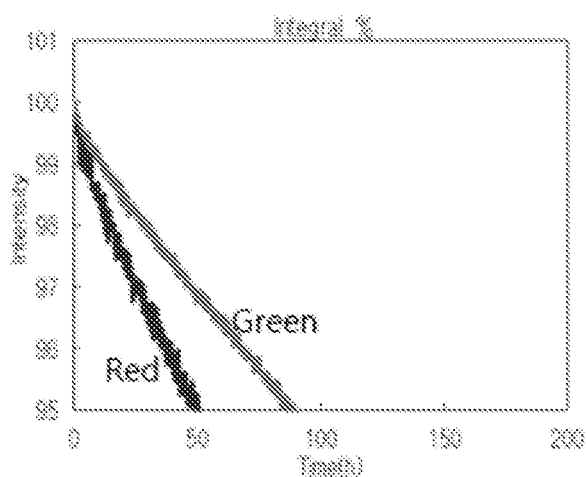
Figure 5C:
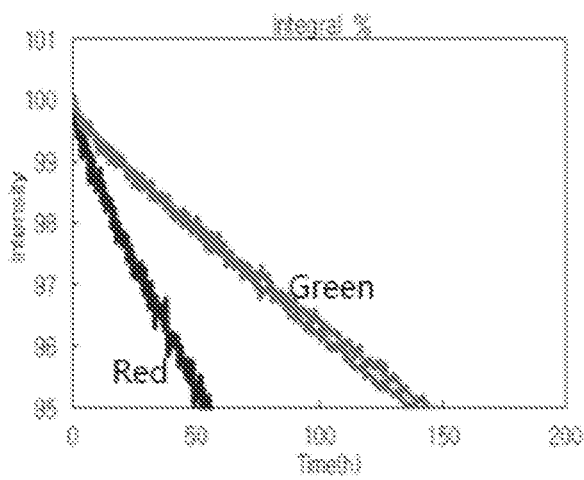
Figure 5D:
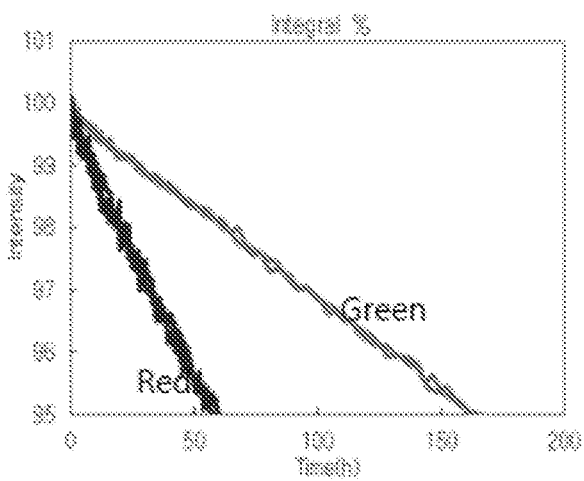

The third experimental example of FIG. 4D is the case where first and second green emission layers were sequentially deposited on the red emission layer to thicknesses of 200 Å and 100 Å respectively and include a single electron transport host, and a green dopant is respectively added thereto in amounts of 10 wt % and 7 wt %.

TABLE 1

|   | Comparative Example (FIG. 4A) | First Experimental Example (FIG. 4B) | Second Experimental Example (FIG. 4C) | Third Experimental Example (FIG. 4D) |
|---|---|---|---|---|
| G2 | E-host + H-host [6:4] (G dopant-7 wt %) | E-host (G dopant-7 wt %) | E-host + H-host [8:2] (G dopant-7 wt %) | E-host (G dopant-7 wt %) |
| G1 | E-host + H-host [6:4] (G dopant-10 wt %) | E-host + H-host[8:2] (G dopant-10 wt %) | E-host (G dopant-10 wt %) | E-host (G dopant-10 wt %) |
| R | E-host + H-host [3:7] (R dopant-2.5 wt %) | E-host + H-host [3:7] (R dopant-2.5 wt %) | E-host + H-host [3:7] (R dopant-2.5 wt %) | E-host + H-host [3:7] (R dopant-2.5 wt %) |
| R lifespan(hours)_95% | 50 | 50 | 55 | 55 |
| G lifespan(hours)_95% | 90 | 90 | 145 | 155 | the electron transport host and the hole transport host are mixed in a ratio of 3:7. Therefore, commonly in the examples, the stacks includes the green emission layers and the red emission layer in the same stack and thus the red emission layer can help to move holes into the green emission layers with a red emission since the red emission layer has a strong hole transport property.

In addition, the comparative example of FIG. 4A is the case where first and second green emission layers were doubly deposited on the red emission layer to thicknesses of 200 Å and 100 Å respectively, each of the first and second green emission layers includes an electron transport host and a hole transport host with a ratio of 6:4, and a green dopant was added thereto in different doping densities of 10 wt % and 7 wt %.

In addition, the first experimental example of FIG. 4B is the case where a first green emission layer was deposited in contact with the red emission layer to a thickness of 200 Å and includes two kinds of hosts (including both an electron transport host and a hole transport host with a ratio of 8:2), which are suitable for a yellow-green emission layer, and a green dopant of 10 wt %, and subsequently, a second green emission layer was deposited to a thickness of 100 Å and includes a single electron transport host and a green dopant of 7 wt %.

The second experimental example of FIG. 4C is the case where a first green emission layer was deposited in contact When comparing the comparative example and the first to third experimental examples, as illustrated in Table 1 and FIGS. 5A to 5D, it could be found that the lifespan of the green emission layer was increased by 60% or more in the second and third experimental examples.

In addition, it could be found that, although the lifespan of the red emission layer was slightly increased in the second and third experimental examples, this is within an error range, and in the white organic light emitting layer of the present disclosure, the lifespan of the green emission layer was much increased when the green emission layer includes a green dopant having particular HOMO and LUMO characteristics and a single electron transport material. That is, it will be appreciated that an increase in lifespan is achieved by particular physical properties of the green emission layer that is disposed close to the red emission layer, and that the white organic light emitting layer having three photoluminescence peaks achieves an increase in color gamut and lifespan.

In addition, as could be found from the above experimental examples, the lifespan is increased to a given extent only when the green emission layer includes a single electron transport host having a thickness of at least 200 Å. Accordingly, when the single electron transport host included in the green emission layer is formed in a thickness corresponding to the total thickness of the green emission layer, or is formed to a thickness of at least 200 Å, the luminous efficacy of a stack having multiple emission layers may be increased.

Meanwhile, although the luminous efficacy of red light was lower than the luminous efficacy of green light in the above-described experimental examples, upon color display, variation in the lifespan of the organic light emitting device during long-time driving may be prevented by increasing the efficiency of a thin film transistor in a red sub-pixel compared to that in a green sub-pixel.

In the white organic light emitting device and the organic light emitting display device of the present disclosure, with regard to a stack having different emission layers in contact with each other, a major emission layer thereof includes a single electron transport host and a dopant, which has a good hole-trapping property and has an energy band gap included in the energy band gap of the electron transport host, so as to equalize hole injection and electron injection to the major emission layer and prevent holes and electrons from accumulating in other common layers, other than the emission layer. Thereby, the efficiency of combination of holes and electrons in the emission layer may be increased, and the charge balance of the emission layer may be improved, which may result in an increase in lifespan.

Figure 6:
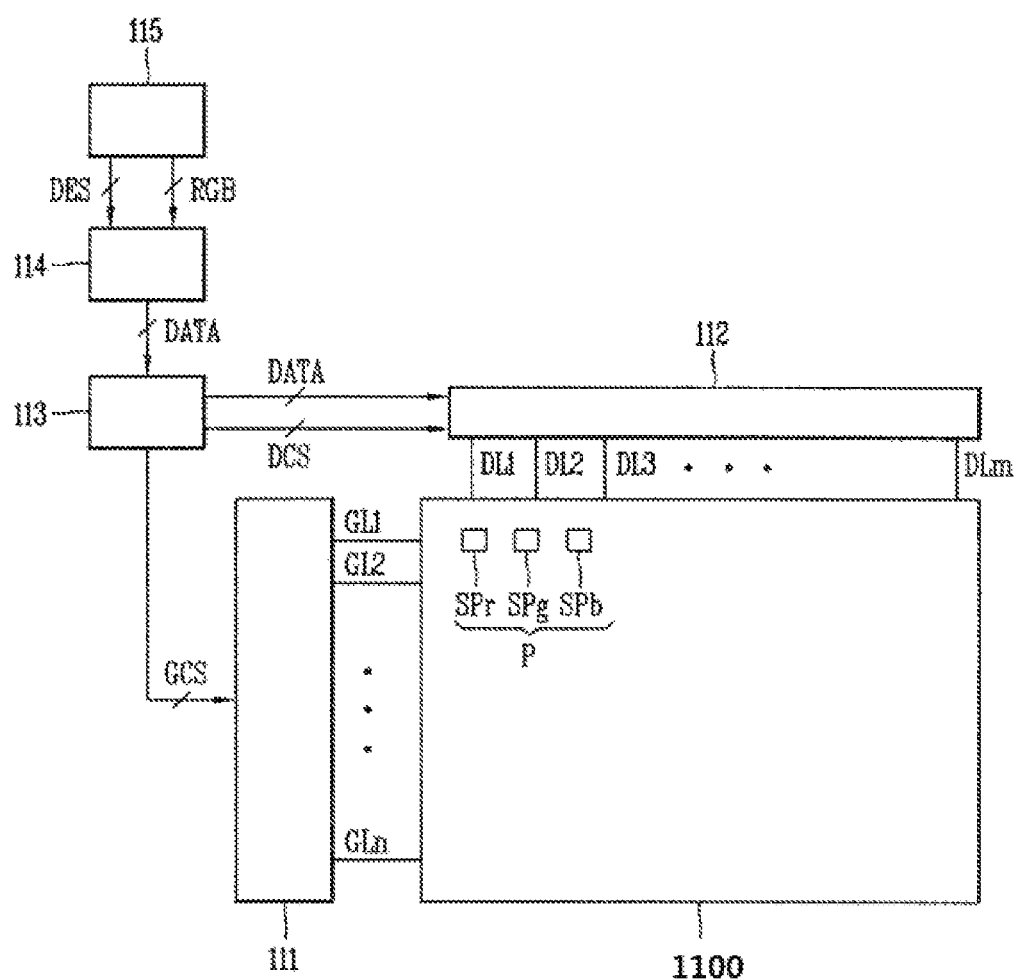
FIG. 6 is a schematic block diagram of the white organic light emitting device applied to an organic light emitting display device according to the present disclosure.
Figure 7:
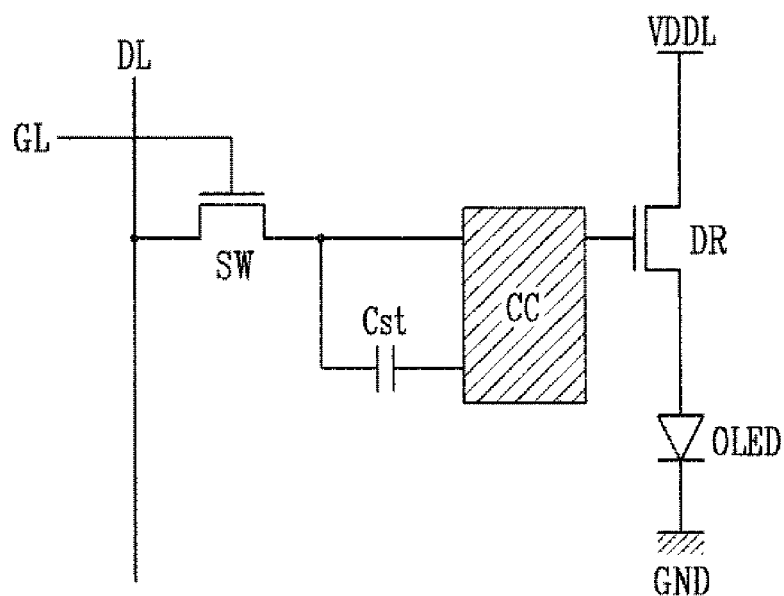
FIG. 7 is a circuit diagram of each sub-pixel of FIG. 6.
Figure 8:
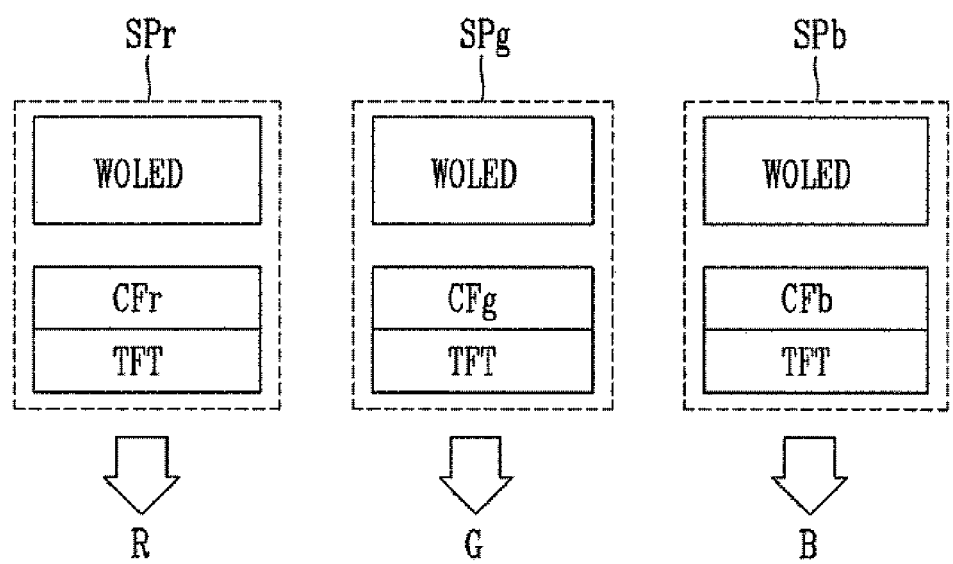
FIG. 8 is a schematic view illustrating the layering of each sub-pixel in the organic light emitting display device according to the present disclosure.

FIG. 6 is a schematic block diagram of the white organic light emitting device applied to the organic light emitting display device according to the present disclosure, FIG. 7 is a circuit diagram of each sub-pixel of FIG. 6, and FIG. 8 is a view briefly illustrating the layering of each sub-pixel in the organic light emitting display device according to the present disclosure.

As illustrated in FIG. 6, the organic light emitting display device of the present disclosure includes an image processor 115, a data converter 114, a timing controller 113, a data driver 112, a gate driver 111, and a display panel 1100.

The image processor 115 performs various image processing such as, for example, setting of a gamma voltage, so as to realize maximum brightness depending on an average image level using RGB data signals, and thereafter outputs the RGB data signals. In addition to the RGB data signals, the image processor 115 outputs driving signals including one or more of a vertical synchronization signal Vsync, a horizontal synchronization signal Hsync, a data enable signal DES, and a clock signal CLK.

The timing controller 113 receives the driving signals including one or more of the vertical synchronization signal Vsync, the horizontal synchronization signal Hsync, the data enable signal DES, and the clock signal CLK from the image processor 115 or the data converter 114. The timing controller 113 outputs a gate timing control signal GCS for controlling the operation timing of the gate driver 111 and a data timing control signal DCS for controlling the operation timing of the data driver 112 based on the driving signals.

The timing controller 113 outputs a data signal DATA corresponding to the gate timing control signal GCS and the data timing control signal DCS.

The data driver 112 samples and latches the data signal DATA supplied from the timing controller 113 in response to the data timing control signal DCS supplied from the timing controller 113, and then converts the data signal DATA into a gamma reference voltage and outputs the same. The data driver 112 outputs the converted data signal DATA through data lines DL1 to Dlm. The data driver 112 is formed into an integrated circuit (IC).

The gate driver 111 outputs a gate signal while shifting the level of a gate voltage in response to the gate timing control signal GCS supplied from the timing controller 113. The gate driver 111 outputs the gate signal through gate lines GL1 to GLn. The gate driver 111 is formed into an IC, or is formed in the display panel 1100 in a gate-in-panel manner.

The display panel 1100 is formed, for example, into a sub-pixel structure including a red sub-pixel SPr, a green sub-pixel SPg, and a blue sub-pixel SPb. That is, one pixel P includes red, green and blue sub-pixels. In some cases, the pixel may further include a white sub-pixel SPw.

As illustrated in FIG. 7, each sub-pixel has a basic 2T1C structure including a switching transistor, a driving transistor, a capacitor, and an organic light emitting diode, and may further include a transistor and a capacitor. In addition, this circuit configuration is provided between a gate line GL, which is formed in a first direction, and a data line DL and a driving voltage line VDDL, which are formed in a direction crossing the first direction.

The organic light emitting display device includes the organic light emitting diode, which emits light, in each sub-pixel, and may further include a compensation circuit CC for each sub-pixel in order to prevent deterioration of the organic light emitting diode. In some cases, the compensation circuit may be omitted.

The switching transistor SW performs a switching operation to allow a data signal, supplied through the data line DL, to be stored as a data voltage in the storage capacitor Cst in response to a gate signal supplied through the gate line GL.

The driving transistor DR operates to move driving current between the driving voltage line VDDL and a ground line GND based on the data voltage stored in the storage capacitor Cst.

The compensation circuit CC compensates for, for example, a threshold voltage of the driving transistor DR. The compensation circuit CC may include one or more transistors and a capacitor. The compensation circuit CC may be configured in various other ways, and a detailed illustration and description thereof will be omitted.

The organic light emitting display device having the sub-pixel structure described above may be realized as a top-emission type, a bottom-emission type, or a double-side-emission type, according to the direction in which light is emitted.

The organic light emitting display device of the present disclosure is configured to emit light in a given direction. The organic light emitting display device may implement bottom emission, as illustrated in FIG. 8, or may implement top emission. The direction in which light is emitted may be determined according to which one of the first electrode 110 and the second electrode 120 is used as a reflective electrode. Top emission may be implemented when the reflective electrode is the first electrode 110, and bottom emission may be implemented when the reflective electrode is the second electrode 120. Here, an electrode, other than the reflective electrode, is a transparent electrode.

As illustrated in FIG. 8, red, green, and blue sub-pixels respectively include a thin film transistor TFT including the driving transistor DR and a white organic light emitting diode WOLED that emits white light to thereby implement white light emission, and are provided with color filters CFr, CFg and CFb of corresponding colors to enable color display. As described above, each sub-pixel includes a circuit including, for example, the driving transistor DR (FIG. 10) for the driving of the organic light emitting diode.

Here, the white organic light emitting device includes a substrate having a plurality of sub-pixels (corresponding to the display panel 1100 of FIG. 6), the driving transistor DR provided in each sub-pixel on the substrate, and the white organic light emitting diode WOLED of FIG. 1, which includes the first electrode 110 and the second electrode 120, any one of which is connected to the driving transistor DR and which are opposite each other, and a plurality of stacks between the first and second electrodes 110 and 120.

Here, in the white organic light emitting diode WOLED, any one stack among the multilayered stacks includes a green emission layer having a first photoluminescence peak within a wavelength range from 520 nm to 540 nm and a red emission layer having a second photoluminescence peak within a wavelength range from 610 nm to 640 nm, the green emission layer and the red emission layer being in contact with each other, and the other stacks respectively include a blue emission layer having a third photoluminescence peak within a wavelength range from 446 nm to 466 nm.

According to the present disclosure, when respective sub-pixels are configured to have a white organic light emitting device, which emits white light, in common, deposition of an organic material of the organic light emitting device is implemented, rather than providing red, green and blue organic light emitting devices to the respective sub-pixels. Accordingly, it is not necessary to use a metal deposition mask since area division is unnecessary, and therefore an increase in the size of the organic light emitting device may be easily realized. In addition, since the organic light emitting device has uniform characteristics in all areas, each sub-pixel may include a white organic light emitting device having a combination of emission layers, each of which includes a particular dopant and has a particular wavelength range, and each sub-pixel may implement light emission in such a manner that white light passes through a color filter provided for each sub-pixel. Accordingly, a color gamut is broadened to meet standards that require an increasingly broad gamut, and display of colors close to natural colors is possible.

The white organic light emitting device of the present disclosure has three clearly separated peak wavelengths, has the maximum photoluminescence intensity at the shortest wavelength, and achieves an increase in color gamut to suit an increasingly broad gamut requirement.

As is apparent from the above description, in a white organic light emitting device and an organic light emitting display device using the same according to the present disclosure, with regard to a structure having multiple emission stacks, a stack including a green emission layer and a red emission layer disposed in contact with each other and a stack having a blue emission layer are provided to achieve even light emission throughout red, green and blue wavelength ranges, which may result in an excellent color gamut.

In addition, in the white organic light emitting device and the organic light emitting display device according to the present disclosure, with regard to the stack having different emission layers in contact with each other, a major emission layer thereof includes a single electron transport host and a dopant, which has a good hole-trapping property and has an energy band gap included in the energy band gap of the electron transport host, so as to equalize hole injection and electron injection to the major emission layer and prevent holes and electrons from being accumulated in other common layers, other than the emission layer. Thereby, the efficiency of combination of holes and electrons in the emission layer may be increased, and the charge balance of the emission layer may be improved, which may result in an increase in lifespan.

Although the aspects of the present disclosure have been described above in detail with reference to the accompanying drawings, it will be apparent to those skilled in the art that the present disclosure described above is not limited to the aspects described above, and various substitutions, modifications, and alterations may be devised within the spirit and scope of the present disclosure. Accordingly, various aspects disclosed in the present disclosure are not intended to limit the technical sprit of the present disclosure, and the scope of the technical sprit of the present disclosure is not limited by the aspects. Accordingly, the disclosed aspects are provided for the purpose of description and are not intended to limit the technical scope of the disclosure, and the technical scope of the disclosure is not limited by the aspects. The range of the disclosure should be interpreted based on the following claims, and all technical ideas that fall within the range equivalent to the claims should be understood as belonging to the scope of the disclosure.

What is claimed is:

1. A white organic light emitting device, comprising:
   first to third stacks sequentially disposed on a first electrode, and a second electrode on the third stack,
   wherein one of the first to third stacks includes a first emission layer and a second emission layer that emit different colors of light, and the first emission layer and the second emission layer are in contact with each other,
   wherein the first emission layer includes a single electron transport host and a first dopant having a lowest unoccupied molecular orbital (LUMO) energy level lower than a LUMO energy level of the single electron transport host,
   wherein the second emission layer includes a second dopant different from the first dopant, and
   wherein the first dopant has a highest occupied molecular orbital (HOMO) energy level higher than a HOMO energy level of the single electron transport host.

2. The device according to claim 1, wherein the first dopant has an energy band gap ranging from 2.5 eV to 2.7 eV.

3. The device according to claim 2, wherein the single electron transport host has an electron mobility ranging from $1.0 \times 10^{-4}$ cm$^2$/Vs to $1.0 \times 10^{-2}$ cm$^2$/Vs.

4. The device according to claim 1, wherein the first emission layer is a green emission layer having a first photoluminescence peak within a wavelength range from 520 nm to 560 nm, and
   wherein the second emission layer is a red emission layer having a second photoluminescence peak within a wavelength range from 600 nm to 650 nm.

5. The device according to claim 4, wherein each of the two stacks having no first and second emission layers includes a blue emission layer having a third photoluminescence peak within a wavelength range from 440 nm to 470 nm.

6. The device according to claim 1, wherein the first emission layer includes a plurality of first emission layers.

7. The device according to claim 6, wherein the first emission layers respectively include the same host and the first dopant having different doping concentrations.

8. The device according to claim 1, further comprising:
   a first charge generation layer between the first stack and the second stack; and
   a second charge generation layer between the second stack and the third stack.

9. The device according to claim 8, wherein the first and second emission layers are located in the second stack, and the second emission layer is closer to the first charge generation layer than the first emission layer, and
   wherein the first and third stacks include first and second blue emission layers, respectively.

10. The device according to claim 9, further comprising a common layer on at least one location selected from a location between the first blue emission layer and the first electrode, a location between the second blue emission layer and the second electrode, a location between the second emission layer and the first charge generation layer, a location between the first emission layer and the second charge generation layer, a location between the first blue emission layer and the first charge generation layer, and a location between the second charge generation layer and the second blue emission layer.

11. The device according to claim 9, further comprising a common layer provided on at least one location selected from among a location between the first blue emission layer and the first electrode, a location between the second blue emission layer and the second electrode, a location between the second emission layer and the first charge generation layer, a location between the first emission layer and the second charge generation layer, a location between the first blue emission layer and the first charge generation layer, and a location between the second charge generation layer and the second blue emission layer.

12. An organic light emitting display device comprising:
a plurality of sub-pixels on a substrate;
a driving transistor in each sub-pixel; and
an organic light emitting diode including a first electrode and a second electrode, one of which is connected to the driving transistor, opposite each other, and first to third stacks between the first electrode and the second electrode,
wherein one of the first to third stacks includes a first emission layer and a second emission layer that emit different colors of light, and the first emission layer and the second emission layer are in contact with each other,
wherein the first emission layer includes a single electron transport host and a first dopant having a LUMO energy level lower than a LUMO energy level of the single electron transport host,
wherein the second emission layer includes a second dopant different from the first dopant, and
wherein the first dopant has a highest occupied molecular orbital (HOMO) energy level higher than a HOMO energy level of the single electron transport host.

13. The device according to claim 12, wherein the first emission layer is a green emission layer having a first photoluminescence peak within a wavelength range from 520 nm to 560 nm, and
wherein the second emission layer is a red emission layer having a second photoluminescence peak within a wavelength range from 600 nm to 650 nm.

14. The device according to claim 13, wherein each of the other two stacks having no first and second emission layers includes a blue emission layer having a third photoluminescence peak within a wavelength range from 440 nm to 470 nm.

15. The device according to claim 12, further comprising:
a first charge generation layer between the first stack and the second stack; and
a second charge generation layer between the second stack and the third stack.

16. The device according to claim 15, wherein the first and second emission layers are located in the second stack, and the second emission layer is closer to the first charge generation layer than the first emission layer, and the first and third stacks include first and second blue emission layers, respectively.

17. The device according to claim 12, wherein the first emission layer includes a plurality of first emission layers.

18. The device according to claim 17, wherein the first emission layers respectively include the same host and the first dopant having different doping concentrations.

* * * * *